United States Patent
Xiao

(10) Patent No.: US 9,875,943 B2
(45) Date of Patent: *Jan. 23, 2018

(54) COMPLEMENTARY METAL-OXIDE-SEMICONDUCTOR FIELD-EFFECT TRANSISTOR AND METHOD THEREOF

(71) Applicant: ZING SEMICONDUCTOR CORPORATION, Shanghai (CN)

(72) Inventor: Deyuan Xiao, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/166,076

(22) Filed: May 26, 2016

(65) Prior Publication Data
US 2017/0110373 A1   Apr. 20, 2017

(30) Foreign Application Priority Data
Oct. 15, 2015   (CN) .......................... 2015 1 0671009

(51) Int. Cl.
*H01L 21/8238* (2006.01)
*H01L 27/092* (2006.01)
(Continued)

(52) U.S. Cl.
CPC ............... *H01L 21/823807* (2013.01); *H01L 21/02532* (2013.01); *H01L 21/02546* (2013.01);
(Continued)

(58) Field of Classification Search
None
See application file for complete search history.

(56) References Cited

U.S. PATENT DOCUMENTS

2013/0270512 A1* 10/2013 Radosavljevic ........................... H01L 21/823807 257/9
2014/0034908 A1*  2/2014 Bangsaruntip ........ H01L 29/775 257/27

(Continued)

FOREIGN PATENT DOCUMENTS

JP       2009071270 A    4/2009
JP       2010245514 A    10/2010

OTHER PUBLICATIONS

Yat, Li, et al. "Dopant-Free GaN/AlN/AlGaN Radial Nanowire Heterostructures as High Electron Mobility Transistors, Dopant-Free GaN/AlN/AlGaN Radial Nanowire Heterostructures as High Electron Mobility Transistors", Nano Lett., 2006 6 (7) pp. 1468-1473.

*Primary Examiner* — Tom Thomas
*Assistant Examiner* — Steven B Gauthier
(74) *Attorney, Agent, or Firm* — Huffman Law Group, PC

(57) ABSTRACT

A complementary metal-oxide-semiconductor field-effect transistor comprises a semiconductor substrate, N-type and P-Type field-effect transistors positioned in the semiconductor substrate. Each of the field-effect transistor includes a germanium nanowire, a III-V compound layer surrounding around the germanium nanowire, a potential barrier layer mounted on the III-V compound layer, a gate dielectric layer, a gate, a source region and a drain region mounted on two sides of the gate. The field-effect transistor can produce two-dimensional electron gases and two-dimensional electron hole gases, and enhance the carrier mobility of the complementary metal-oxide-semiconductor field-effect transistor.

12 Claims, 11 Drawing Sheets

(51) Int. Cl.
*H01L 29/06* (2006.01)
*H01L 29/423* (2006.01)
*H01L 29/786* (2006.01)
*H01L 29/49* (2006.01)
*H01L 21/02* (2006.01)

(52) U.S. Cl.
CPC .......... *H01L 21/02603* (2013.01); *H01L 21/823814* (2013.01); *H01L 21/823842* (2013.01); *H01L 27/092* (2013.01); *H01L 29/0673* (2013.01); *H01L 29/42392* (2013.01); *H01L 29/4908* (2013.01); *H01L 29/78618* (2013.01); *H01L 29/78681* (2013.01); *H01L 29/78684* (2013.01); *H01L 29/78696* (2013.01)

(56) References Cited

U.S. PATENT DOCUMENTS

2015/0035071 A1* 2/2015 Ching .................. H01L 27/092 257/369
2015/0053928 A1* 2/2015 Ching ............. H01L 21/823821 257/29
2016/0293772 A1* 10/2016 Xiao ................ H01L 29/78696

* cited by examiner

COMPLEMENTARY METAL-OXIDE-SEMICONDUCTOR FIELD-EFFECT TRANSISTOR AND METHOD THEREOF

INCORPORATION BY REFERENCE

This application claims priority from P.R.C. Patent Application No. 201510671009.X, filed on Oct. 15, 2015, the contents of which are hereby incorporated by reference in their entirety for all purposes.

TECHNICAL FIELD

The present invention relates to a method for manufacturing a semiconductor device, and particularly relates to a complementary metal-oxide-semiconductor field-effect transistor and method thereof.

BACKGROUND

A high-electron-mobility transistor (HEMT) includes a modulation doped heterojunction structure. Because band gaps of two materials composing the heterojunction structure are different, potential wells and potential barriers are formed at the interface of the heterojunction structure after the gate of the heterojunction structure is biased. Because a polarization effect or free electrons are accumulated at the potential wells near the interface of the heterojunction structure, two dimensional electron gases (2-DEG) are formed at the potential wells. Because the two-dimensional electron gas is not affected by scattered impurity ions, the electron mobility of the two dimensional electron gas is very high. Moreover, an impurity center is not frozen at a very low temperature because electrons are spaced apart the impurity center, so that HEMT has a very perfect performance at a very low temperature and can be used for a research work (such as fractional quantum Hall effect) at a very low temperature. HEMT is a voltage controlling device, and the depths of the potential wells can be regulated by the gate voltage (Vg) to control the surface density of 2-DEG in the potential wells to control HEMT's operating current. A middle region of an ingot with the same diameter only can be used for cutting a wafer, and head and tail regions of the ingot need to be removed. Because the weights of the head and tail regions gradually increase with the diameter of the ingot, it needs to recycle the ingot for reducing the cost and enhancing the performance.

SUMMARY

An object of the present invention application is to provide a complementary metal-oxide-semiconductor field-effect transistor and method thereof, wherein complementary metal-oxide-semiconductor field-effect transistor is a high electron mobility transistor and has better performance.

In order to solve the above problems, the present invention provides a complementary metal-oxide-semiconductor (CMOS) field-effect transistor (FET). The CMOSFET comprises of: a semiconductor substrate; a N-type field-effect transistor positioned in the semiconductor substrate, the N-type field-effect transistor including a first germanium nanowire, a first III-V compound layer surrounding around the first germanium nanowire, a first potential barrier layer mounted on the first III-V compound layer, a first gate dielectric layer, a first gate, a first source region and a first drain region mounted on two sides of the first gate; and a P-type field-effect transistor positioned in the semiconductor substrate and spaced apart the N-type field-effect transistor, the P-type field-effect transistor including a second germanium nanowire, a second III-V compound layer surrounding around the second germanium nanowire, a second potential barrier layer mounted on the second III-V compound layer, a second gate dielectric layer, a second gate, a second source region and a second drain region mounted on two sides of the second gate.

The present invention application further provides a method for manufacturing a complementary metal-oxide-semiconductor field-effect transistor, and steps of the method comprising: forming a two dimensional electron gas at a first III-V compound layer of a N-type field-effect transistor; forming a two dimensional electron hole gas at a second germanium nanowire of a P-type field-effect transistor, the mobility of the two dimensional electron gas being higher than the mobility of the two dimensional electron hole gas, such that the complementary metal-oxide-semiconductor field-effect transistor having better electrical performances. Moreover, the P-type and N-type field-effect transistors are surrounded by gates to enhance electrical performances of the complementary metal-oxide-semiconductor field-effect transistor.

BRIEF DESCRIPTION OF THE DRAWINGS

Exemplary embodiments will be more readily understood from the following detailed description when read in conjunction with the appended drawing, in which.

DETAILED DESCRIPTION

Figure 1:
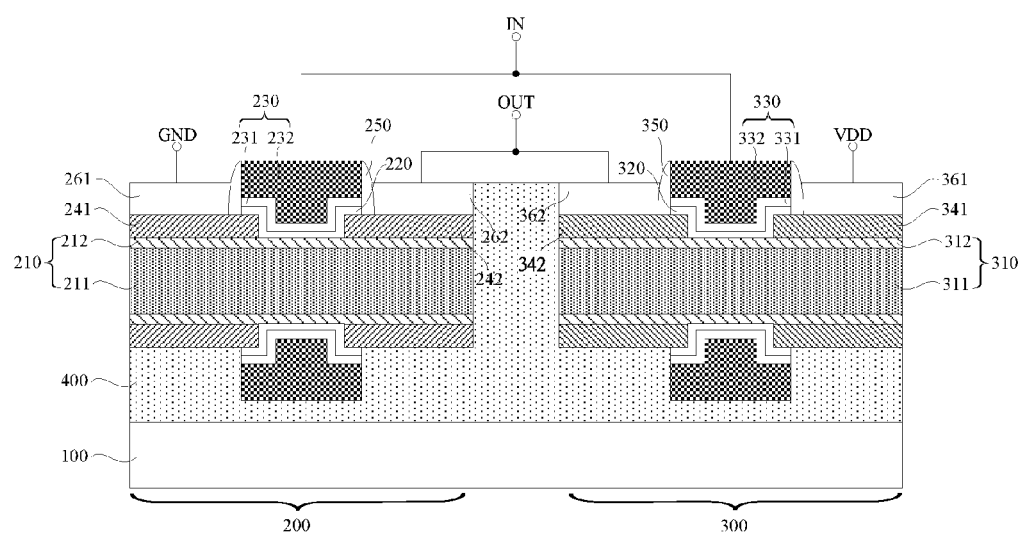
FIG. 1 is a cross-sectional view of a complementary metal-oxide-semiconductor field-effect transistor according to one embodiment of the present invention.

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein.

The main idea of the present invention is to provide a complementary metal-oxide-semiconductor field-effect transistor and a method thereof, the field-effect transistor comprising: a semiconductor substrate; a N-type field-effect transistor positioned in the semiconductor substrate, the N-type field-effect transistor including a first germanium nanowire, a first III-V compound layer surrounding around the first germanium nanowire, a first barrier layer mounted on the first III-V compound layer, a first gate dielectric layer, a first gate, a first source region and a first drain region mounted on two sides of the first gate; and a P-type field-effect transistor positioned in the semiconductor substrate and spaced apart the N-type field-effect transistor, the P-type field-effect transistor including a second germanium nanowire, a second III-V compound layer surrounding around the second germanium nanowire, a second barrier layer mounted on the second III-V compound layer, a second gate dielectric layer, a second gate, a second source region and a second drain region mounted on two sides of the second gate. The field-effect transistor can produce two-dimensional electron gases and two-dimensional electron hole gases, and the field-effect transistor is a gate-surrounding device and the carrier mobility of the field-effect transistor is high.

Reference is now made to the following description taken in conjunction with the accompanying drawings. The invention application provides a complementary metal-oxide-semiconductor field-effect transistor shown in FIG. 1, this field-effect transistor includes a semiconductor substrate 100, a N-type filed-effect transistor 200 disposed in the semiconductor substrate 100, and a P-type filed-effect transistor 300 positioned in the semiconductor substrate 100. The N-type filed-effect transistor 200 and P-type filed-effect transistor 300 are spaced apart via a dielectric layer 400, wherein the dielectric layer 400 may be silicon dioxide.

In one embodiment of the present invention, the N-type filed transistor 200 includes a first germanium nanowire 211, a first III-V compound layer 212 surrounding around the first germanium nanowire 211, a first potential barrier layer 220 mounted on the first III-V compound layer 212, a first gate dielectric layer 231, a first gate 232, a first source region 241, and a first drain region 242. The first source region 241 and the first drain region 242 are mounted on two opposite sides of the first gate 232 and are disposed above the first III-V compound layer 212. The P-type field-effect transistor 300 includes a second germanium nanowire 311, a second III-V compound layer 312 surrounding around the second germanium nanowire 311, a second potential barrier layer 320 mounted on the second III-V compound layer 312, a second gate dielectric layer 331, a second gate 332, a second source region 341 and a second drain region 342. The second source region 341 and the second drain region 342 are mounted on two opposite sides of the second gate 332 and are disposed above the second III-V compound layer 312.

Any one person having ordinary skill in the art will understand the terminology terms "first", "second" are not intended to be a limitation of several manufacture process parameters or devices, such as a germanium nanowire, or a gate dielectric layer. These terminology terms are only used for distinguishing a manufacture process parameter or device from another manufacture process parameter or device. Therefore, the terminology terms "first germanium nanowire", "first gate dielectric layer" or "first gate" discussed below may be addressed by "second germanium nanowire", "second gate dielectric layer" or "second gate" without departing from the scope or spirit of the present invention In one embodiment, the first germanium nanowire 211 and the second germanium nanowire 311 are doped by P-type impurities, and the first III-V compound layer 212 the second III-V compound layer 312 are N-type InGaAs. The first germanium nanowire 211 and the first III-V compound layer 212 form a first channel 210 of the N-type field effect transistor, and the second germanium nanowire 311 and the second III-V compound layer 312 form a second channel 310 of the P-type field-effect transistor.

The materials of the first potential barrier layer 220 and the second potential barrier layer 320 are silicon doped InP, and the InP doped concentration is $1.0 \times 10^{18}$ cm$^{-3}$~$1.5 \times 10^{18}$ cm$^{-3}$. The thickness of any one of the first potential barrier layer 220 and the second potential barrier layer 320 is 50 nm~100 nm. A heterojunction structure of the N-type field-effect transistor is formed between the first potential barrier layer 220 and the first III-V compound layer 212, and a two-dimensional electron gas is accrued between the first III-V compound layer 212 and the first potential barrier layer 220. A heterojunction structure of the P-type field-effect transistor is formed between the second germanium nanowire 311 and the second III-V compound layer 312, and a two-dimensional electron hole gas is accrued between the second germanium nanowire 311 and the second III-V compound layer 312.

The first gate dielectric layer 231 and the second gate dielectric layer 331 are high dielectric materials, and the thickness of any one of the first gate dielectric layer 231 and the second gate dielectric layer 331 is 1 nm~5 nm. The material of the first gate 231 is chosen from TiN, NiAu, and CrAu, and the material of the second gate 232 is chosen form TiN, NiAu, and CrAu. The first gate dielectric layer 231 and the first gate 231 form a gate of N-type field-effect transistor 230, and the second gate dielectric layer 331 and the second gate 332 form a gate of P-type field-effect transistor 330. It should be noted that the P-type field-effect transistor and the N-type field-effect transistor are entirely surrounded by gates to enhance the electrical performance of the complementary-metal-oxide-semiconductor field-effect transistor.

The first source region 241 and first drain region 242 are In$_{0.25}$Ga$_{0.75}$As doped by N-type ions. The second source region 341 and second drain region 342 are In$_{0.25}$Ga$_{0.75}$As doped by P-type ions. The N-type field-effect transistor 200 further comprises a first sidewall 250 positioned at two opposite sides of the first gate 232, a first source 261 mounted on the first source region 241, and a first drain 262 mounted on the first drain region 242. The P-type field-effect transistor 300 further comprises a second sidewall 350 positioned at two opposite sides of the second gate 332, a second source 361 mounted on the second source region 341, and a second drain 362 mounted on the second drain region 342. The first gate 232 is respectively connected with the second gate 332 and an input port (IN) of a complementary metal-oxide-semiconductor field-effect transistor. The first drain 262 is respectively coupled with the second drain 362 and an output port (OUT) of the complementary metal-oxide-semiconductor field-effect transistor. The first source 261 is coupled with a ground (GND), and the second source 361 is coupled with a voltage power supply ($V_{DD}$).

Figure 2:
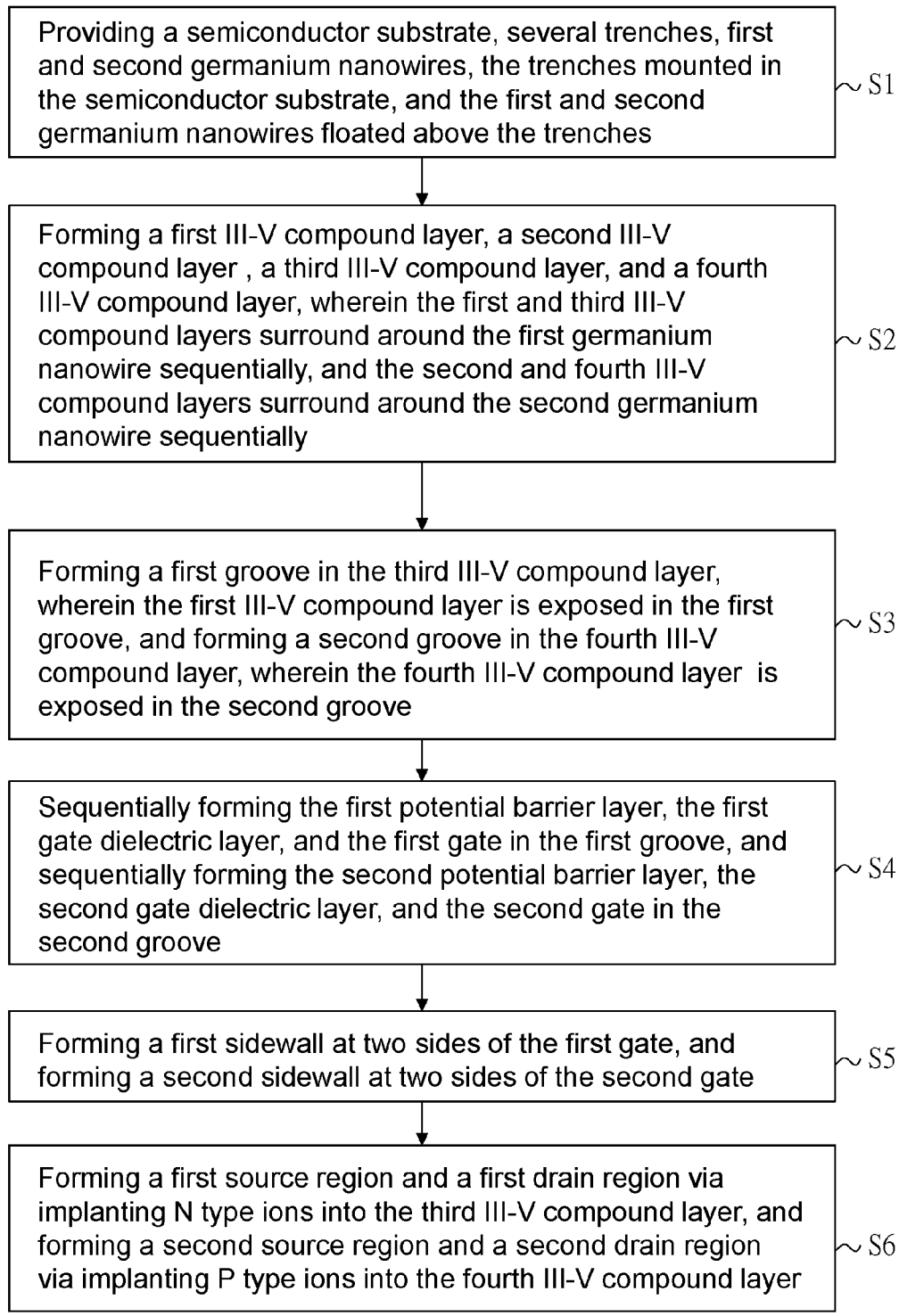
FIG. 2 is a flowchart of a method for manufacturing a complementary metal-oxide-semiconductor field-effect transistor according to one embodiment of the present invention.

This invention further provides a method for manufacturing a complementary metal-oxide-semiconductor field-effect transistor. FIG. 2 is a flowchart for manufacturing a complementary metal-oxide-semiconductor field-effect transistor, wherein FIGS. 3a~3m are cross-sectional views of the N-type field-effect transistor during the manufacture process of the complementary metal-oxide-semiconductor field-effect transistor. Because a person skilled in the relevant field may understand that the structure of the P-type field-effect transistor is similar to the structure of the N-type field-effect transistor during the manufacture process of the complementary metal-oxide-semiconductor field-effect transistor, and the structure of the P-type field-effect transistor is not disclosed in the specification. The method for manufacturing the complementary metal-oxide-semiconductor field-effect transistor is described below.

S1 to S6 steps are shown in FIG. 2. In S1 step, providing a semiconductor substrate 100, several trenches, first and second germanium nanowires, wherein the trenches are disposed in the semiconductor substrate 100, and the first and second germanium nanowires are floated above these trenches.

Figure 3A:
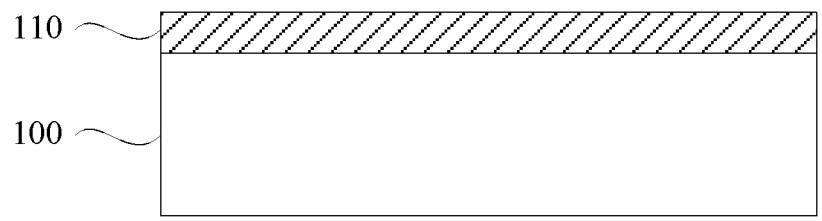
FIGS. 3a-3m are respectively cross-sectional views for manufacturing a complementary metal-oxide-semiconductor field-effect transistor according to one embodiment of the present invention.

The detail contents of S1 step are shown in FIGS. 3a-3g. Referring to FIG. 3a, the semiconductor substrate 100 is covered with a silicon germanium alloy layer 110.

Figure 3B:
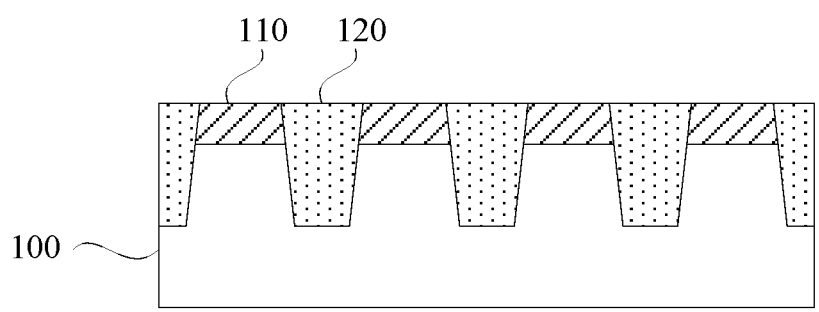

Referring to FIG. 3b, a plurality of shallow trenches 120 are formed in the semiconductor substrate 100, and the plurality of shallow trenches 120 are spaced apart and the silicon germanium alloy layer 110 is segmented by the shallow trenches 120.

Figure 3C:
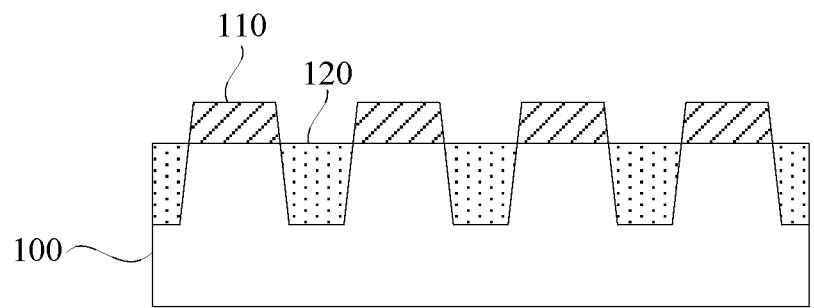

Referring to FIG. 3c, a part of each shallow trench 120 is removed, and one side of the silicon germanium alloy layer 110 is exposed.

Figure 3D:
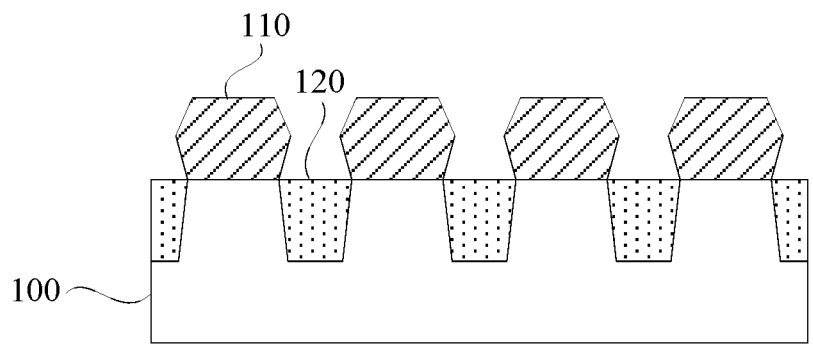

Referring to FIG. 3d, the silicon germanium alloy layer 110 can become a polygon shaped silicon germanium alloy layer via a selective epitaxial growth because growth rates of the silicon germanium alloy layer 110 in all crystal orientations are not the same. For example, the silicon germanium alloy layer 110 can become a hexagon shaped silicon germanium alloy layer via the selective epitaxial growth. It is convenient to oxidize the polygon shaped silicon germanium alloy layer to form a germanium nanowire.

Figure 3E:
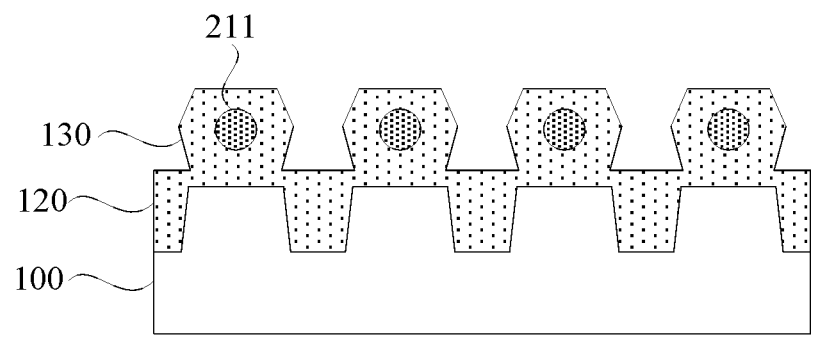

Referring to FIG. 3e, the polygon shaped silicon germanium alloy layer is transferred to a silicon oxide layer 130, the first germanium nanowire 211, and the second germanium nanowire via a thermal oxidation, wherein the silicon oxide layer 130 surrounds around first germanium nanowire 211 and the second germanium nanowire. During the thermal oxidation, silicon and germanium are oxidized and concentrated to become the first germanium nanowire 211 and the second germanium nanowire. In one embodiment, the cross sections of the first germanium nanowire 211 and the second germanium nanowire are circular shapes, and the diameters of the first germanium nanowire 211 and the second germanium nanowire are 10 nm~100 nm. Moreover, the silicon oxide layer 130 is covered with the semiconductor substrate 100 during the thermal oxidation.

Figure 3F:
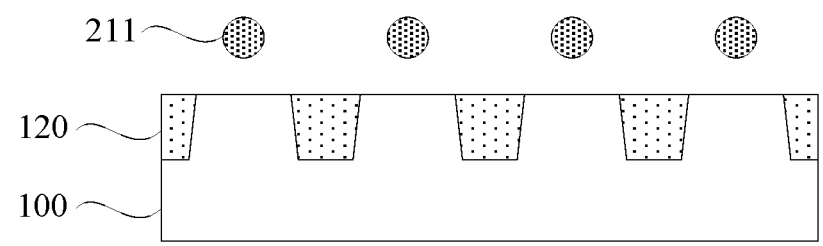

Referring to FIG. 3f, several trenches are formed via removing the silicon oxide layer 130, and the first germanium nanowire 211 and the second germanium nanowire are floated in the trenches. The first germanium nanowire 211 and the second germanium nanowire are annealed at a hydrogen atmosphere so that the surfaces of the first germanium nanowire 211 and the second germanium nanowire become more smooth.

Figure 3G:
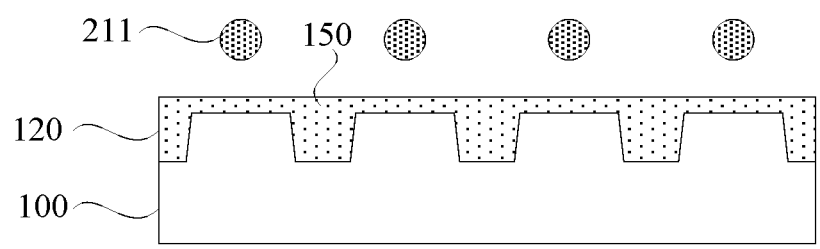

Referring to FIG. 3g, another silicon oxide layer 150 is formed in the trenches in order to protect the semiconductor substrate 100 from damage.

Figure 3H:
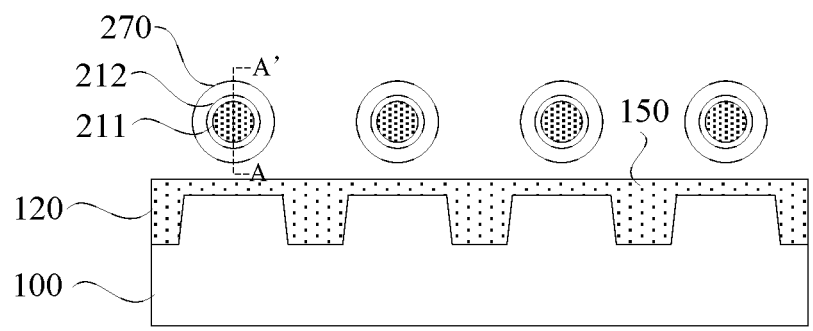
Figure 3I:
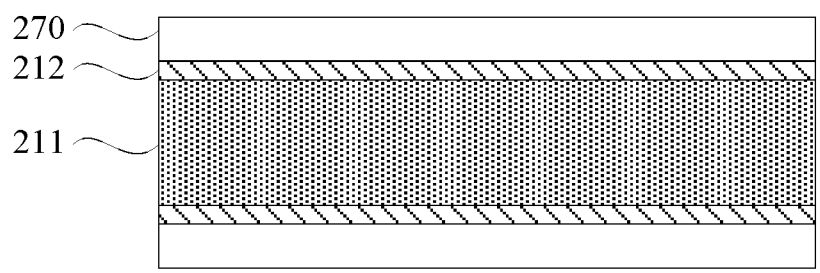

S2 step is shown in FIGS. 3h and 3i, and FIG. 3i is a cross-sectional view of FIG. 3h along an AA' line. Forming the first III-V compound layer 212, the second III-V compound layer 312a, a third III-V compound layer 270, and a fourth III-V compound layer, wherein the first III-V chemical compound layer 212 and the third III-V compound layer 270 surround around the first germanium nanowire 211 sequentially, and the second III-V compound layer 312 and the fourth III-V compound layer surround around the second germanium nanowire sequentially. In one embodiment, the first III-V compound layer 212 and the second III-V compound layer 312 are manufactured by atomic layer deposition (ALD), molecular beam epitaxy (MBE), or metal organic chemical vapor deposition (MOCVD). The materials of the first III-V compound layer 212 and the second III-V compound layer 312 are N type InGaAs. The third III-V compound layer 270 and the fourth III-V compound layer are manufactured by MOCVD, ALD, or MBE. The materials of the third III-V compound layer 270 and the fourth III-V compound layer are $In_{0.25}Ga_{0.75}As$.

Figure 3J:
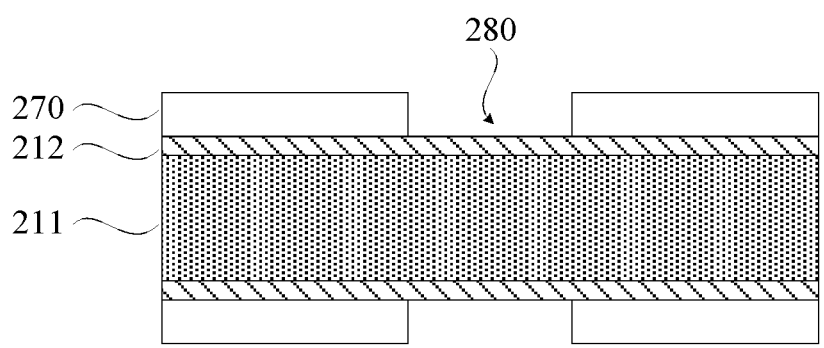

S3 step is shown in FIG. 3j. Forming a first groove 280 in the third III-V compound layer 270, wherein the first III-V compound layer 212 is exposed in the first groove 280. Forming a second groove in the fourth III-V compound layer, wherein the fourth III-V compound layer is exposed in the second groove. The third III-V compound layer 270 and the fourth III-V compound layer are etched to form the first groove 280 and the second groove via induced coupling plasma (ICP).

Figure 3K:
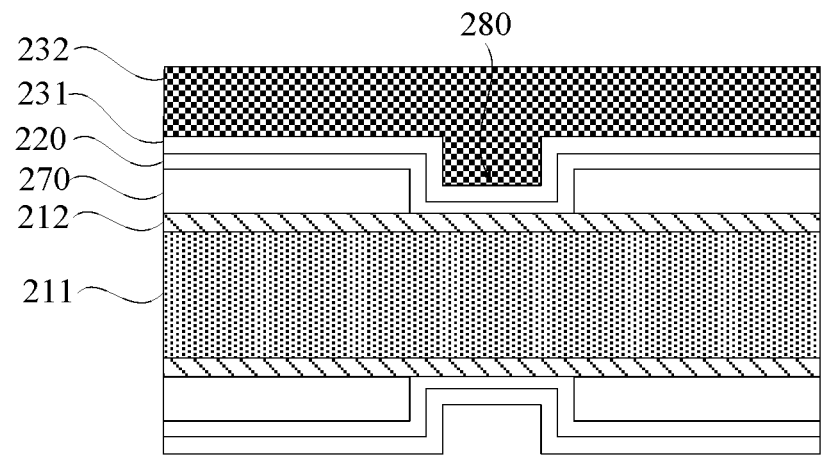

S4 step is shown in FIG. 3k. Forming the first potential barrier layer 220, the first gate dielectric layer 231, and the first gate 232 in the first groove 280 sequentially. Forming the second potential barrier layer, the second gate dielectric layer, and the second gate in the second groove sequentially. In one embodiment, the first potential barrier layer 220 and the second potential barrier layer can be formed by the MOCVD, ALD, or MBE technics. The materials of the first potential barrier layer 220 and the second potential barrier layer 320 are silicon doped InP, and a doped concentration of any one of the first potential barrier layer 220 and the second potential barrier layer 320 is $1.0 \times 10^{18}$ $cm^{-3}$~$1.5 \times 10^{18}$ $cm^{-3}$. The thickness of any one of the first potential barrier layer 220 and the second potential barrier layer is 50 nm~100 nm. The first gate dielectric layer 231 and the second gate dielectric layer are manufactured by MOCVD, ALD, or MBE, and the first gate dielectric layer 231 and the second gate dielectric layer are high dielectric parameter materials. For example, a material of any one of the first gate dielectric layer 231 and the second gate dielectric layer is $Al_2O_3$ or $TiSiO_x$, and a thickness of any one of the first gate dielectric layer 231 and the second gate dielectric layer is 1 nm~5 nm. The first gate 232 and the second gate are manufactured by physical vapor deposition (PVD), MOCVD, ALD, or MBE, and a material of any one of the first gate 231 and the second gate is TiN, NiAu or CrAu. The first potential barrier layer 220, the first gate dielectric layer 231, and the first gate 232 entirely surround around the first channel. The second potential barrier layer, the second gate dielectric layer and the second gate entirely surround around the second channel.

Figure 3L:
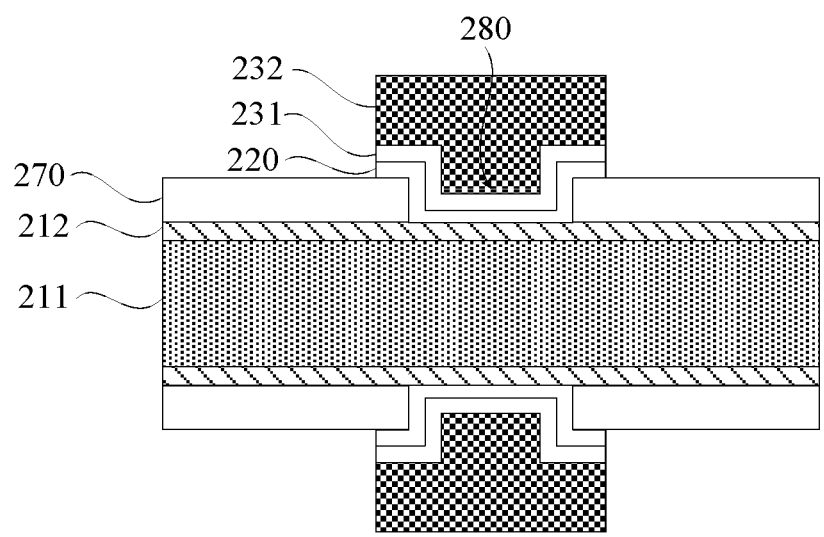

Referring to FIG. 3l, etching a part of the first gate 232, a part of the first gate dielectric layer 231, and a part of the first potential barrier layer 220, retaining a part of the first gate 232 disposed at the first groove 280 and the third III-V compound layer 270, retaining a part of the first gate dielectric layer 231 disposed at the first groove 280 and the third III-V compound layer 270, and retaining a part of the first potential barrier layer 220 disposed at the first groove 280 and the third III-V compound layer 270. Etching a part of the second gate, a part of the second gate dielectric layer, and a part of the second potential barrier layer, retaining a part of the second gate disposed at the second groove and the fourth III-V compound layer, retaining a part of the second gate dielectric layer disposed at the second groove and the fourth III-V compound layer, and retaining a part of the second potential barrier layer disposed at the second groove and the fourth III-V compound layer.

Figure 3M:
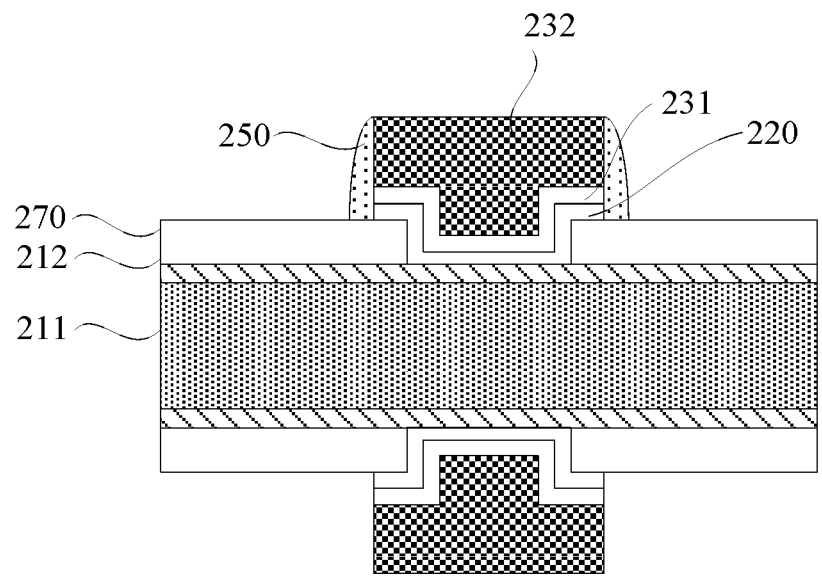

S5 step is shown FIG. 3m. Forming the first sidewall 250 at two sides of the first gate 232, and forming the second sidewall at two sides of the second gate.

Figure 4:
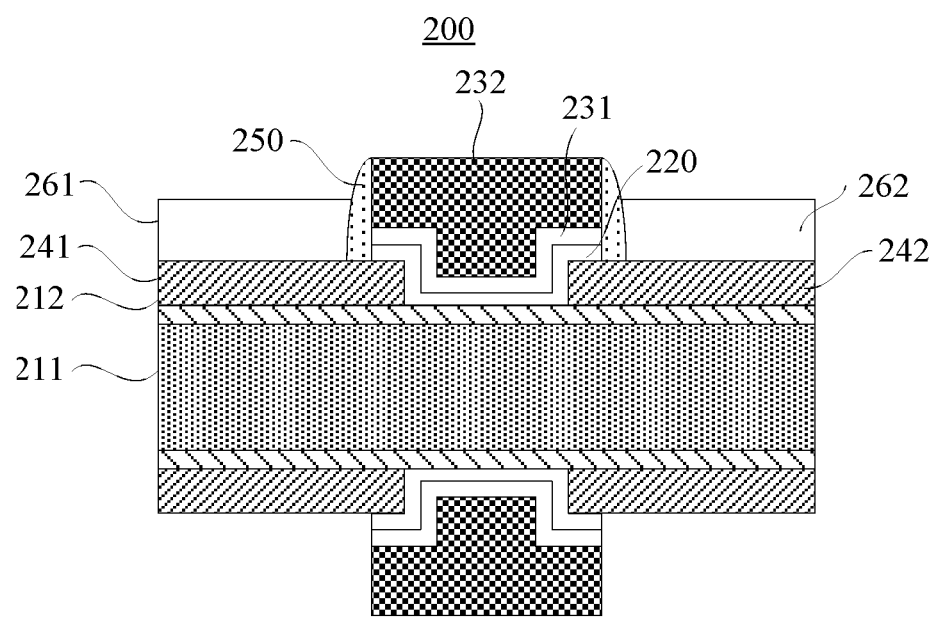
FIG. 4 is a cross-sectional view of a N-type field-effect transistor according to one embodiment of the present invention.

S6 step is shown in FIG. 4. Forming the first source region 241 and the first drain region 242 via implanting N type ions into the third III-V compound layer 270, and forming the second source region 341 and the second drain region 342 via implanting P type ions into the fourth III-V compound layer. According to the present invention, a simple method for manufacturing a source and a drain can form a nonplanar field effect transistor having a smaller parasitic resistance. Moreover, the method for manufacturing a complementary metal-oxide-semiconductor field-effect transistor further comprises a step of forming the first source 261 on the first source region 241, a step of forming the first drain 262 on the first drain region 242, a step of forming the second source 361 on the second source region 341, a step of forming the second drain 362 on the second drain region 342. A material of any one of the first drain 262, the second source 361, and the second drain 362 is TiN, NiAu or CrAu.

Figure 5:
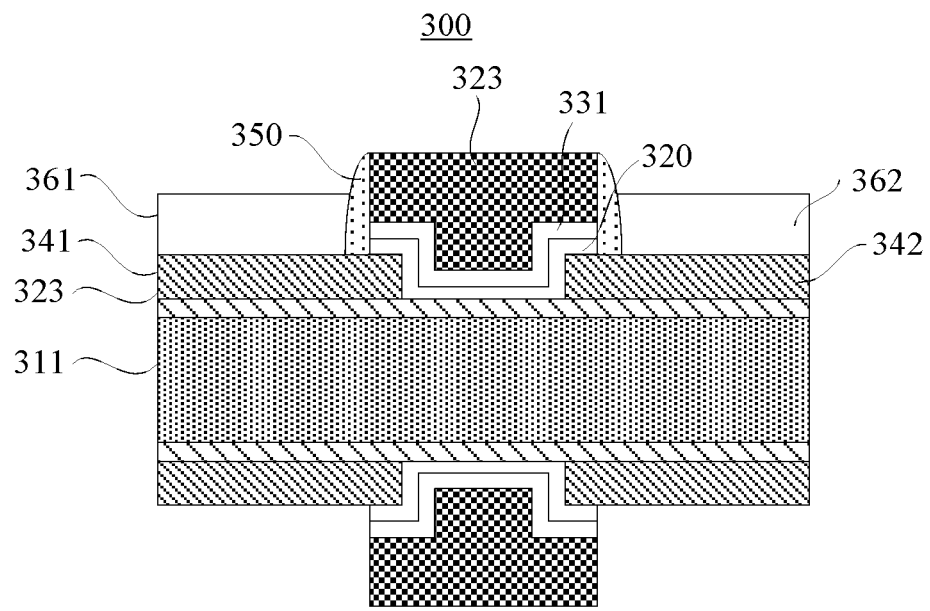
FIG. 5 is a cross-sectional view of a P-type field-effect transistor according to one embodiment of the present invention.

The structure of the P type field-effect transistor 300 is shown in FIG. 5, and a method for manufacturing the P type field-effect transistor 300 is similar to the method for manufacturing the N type field effect transistor 200. The difference between the two manufacture methods is only at S5 step. The third and the fourth III-V compound layers are doped by different types of ions respectively. The difference between the two manufacture methods can be understood by a person skilled in the field and similar contents are not described again. The N type field effect transistor 200 and the P type field effect transistor 300 form the complementary metal-oxide-semiconductor field-effect transistor as shown in FIG. 1.

Figure 6:
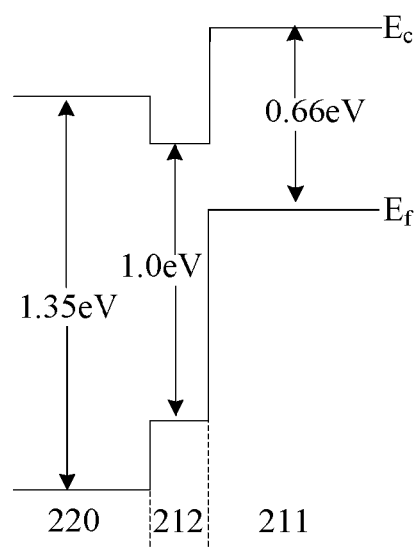
FIG. 6 is an energy band diagram of a non-biased-complementary metal-oxide-semiconductor field-effect transistor according to one embodiment of the present invention.
Figure 7:
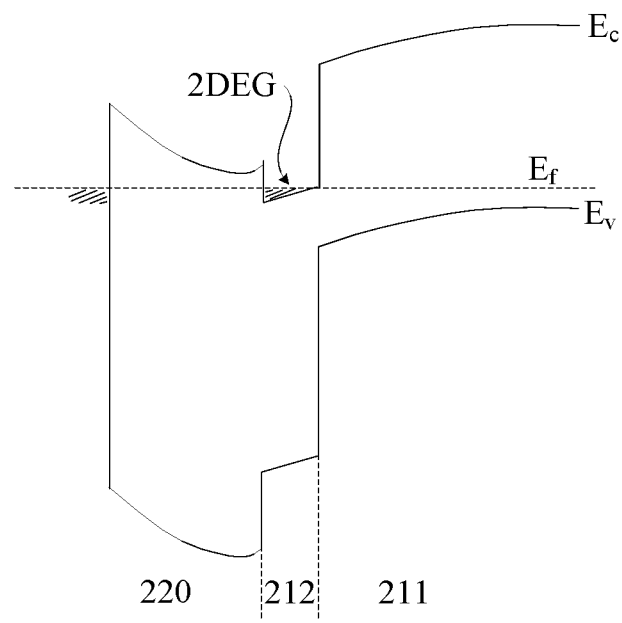
FIG. 7 is an energy band diagram of a forward-biased N-type field-effect transistor according to one embodiment of the present invention.
Figure 8:
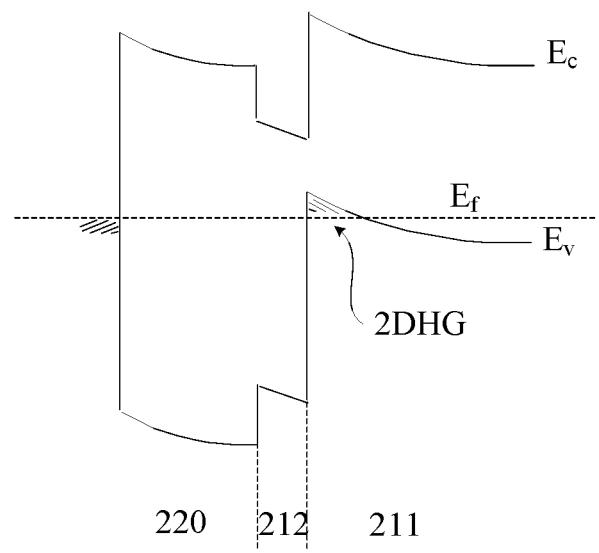
FIG. 8 is an energy band diagram of a reverse-biased P-type field-effect transistor according to one embodiment of the present invention.

Referring to FIG. 6, when an input port (IN) is not biased, energy bands of the N type field effect transistor and the P type field effect transistor are not bent. Referring to FIG. 7, when the input port (IN) is forward biased, a width of a band gap of the first potential barrier layer 220 is wider than a width of a band gap of the first III-V compound layer 212, and a curvature of the band gap of the first potential barrier layer 220 is different than a curvature of the band gap of the first III-V compound layer 212. Moreover, when the input port (IN) is forward biased, a conduction band (Ec) drops below Fermi energy level (Ef) and two dimensional electron gas (2DEG) is accumulated between the first III-V compound layer 212 and the first potential barrier layer 220, the N type field effect transistor is turn on, and the output port (OUT) is coupled with a ground (GND). Referring to FIG. 8, when the input port IN is reverse biased, a curvature of a band gap of the second III-V compound layer 312 is different than a curvature of a band gap of the second germanium nanowire 311. Moreover, when the input port IN is reverse biased, the valence band (Ev) elevates above Fermi energy level (Ef), two dimensional electron hole gas (2DHG) is accumulated between the second III-V compound layer 312 and the second germanium nanowire 311, the P type field effect transistor is turn on, and the output port (OUT) is coupled with a voltage power supply (VDD). According to our invention, 2DEG and 2DHG are higher mobility carriers, and the N type and P type field-effect transistors are high-electron-mobility transistors, such that the transmission performance of the complementary metal-oxide-semiconductor field-effect transistor can be enhanced substantially.

In conclusion, two dimensional electron gas is accrued at the first III-V compound layer of the N type field effect transistor, and two dimensional electron hole gas is accumulated at the second germanium nanowire of the P type field effect transistor. Due to high mobility of two dimensional electron gas and high mobility of two dimensional electron hole gas, the complementary metal-oxide-semiconductor field-effect transistor can have better electrical performances. Moreover, the N type and P type field effect transistors are entirely surrounded by gates, and electrical performance of the complementary metal-oxide-semiconductor field-effect transistor are enhanced.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

What is claimed is:

1. A method for manufacturing a complementary metal-oxide-semiconductor field-effect transistor, and steps of the method comprising:
    providing a semiconductor substrate;
    forming a trench, first and second germanium nanowires, the trench mounted in the semiconductor substrate, and first and second germanium nanowires floated above the trench;
    sequentially forming first and third III-V compound layers, the first and third compound layers surrounding around the first germanium nanowire;
    sequentially forming second and fourth III-V compound layers, the second and fourth compound layers surrounding around the second germanium nanowire;
    forming a first groove in the third III-V compound layer, the first groove exposing the first III-V compound layer;
    forming a second groove in the fourth III-V compound layer, the second groove exposing the second III-V compound layer;
    sequentially forming a first potential barrier layer, a first gate dielectric layer, and a first gate in the first groove;
    sequentially forming a second potential barrier layer, a second gate dielectric layer, and a second gate in the second groove;
    forming a first side wall at two sides of the first gate;
    forming a second side wall at two sides of the second gate;
    forming a first source region and a first drain region via doping N type ions into the third III-V compound layer; and
    forming a second source region and a second drain region via doping P type ions into the fourth III-V compound layer.

2. The method according to claim 1, wherein the step of forming the trench, the first and second germanium nanowires further comprising:
    forming a silicon germanium alloy layer, and silicon germanium alloy layer covering the semiconductor substrate;
    forming a plurality of shallow trenches, and the shallow trenches segmenting the silicon germanium alloy layer;

removing a part of the plurality of shallow trenches, and exposing one side of the silicon germanium alloy layer;

transforming the silicon germanium alloy layer to a polygon shaped silicon germanium alloy layer via a selective epitaxial growth;

transforming the polygon shaped silicon germanium alloy layer to a first silicon oxide layer, the first and second germanium nanowires via a thermal oxidation, the first silicon oxide layer surrounding around the first and second germanium nanowires ;

removing the first silicon oxide layer;

forming the trench, and the first and second germanium nanowires floated in the trench;

annealing the first and second germanium nanowires at a hydrogen atmosphere; and forming a second silicon oxide layer in the trench.

3. The method according to claim 2, wherein cross sections of the first and second germanium nanowires are circular shapes, and the diameters of the first and second germanium nanowires are 10 nm~100 nm.

4. The method according to claim 1, wherein the first and second III-V compound layers are formed by atomic layer deposition(ALD), molecular beam epitaxy(MBE), or metal organic chemical vapor deposition(MOCVD), the first and second III-V compound layers are N type InGaAs.

5. The method according to claim 1, wherein the third and fourth III-V compound layers are formed by atomic layer deposition, molecular beam epitaxy, or metal organic chemical vapor deposition, the materials of the third and fourth III-V compound layers are $In_{0.25}Ga_{0.75}As$.

6. The method according to claim 1, wherein the third and fourth III-V compound layers are etched to from the first and second grooves via induced coupling plasma (ICP).

7. The method according to claim 1, wherein the first potential barrier layer and the second potential barrier layer are formed by ALD, MBE, or MOCVD, the first and second potential barrier layers are silicon doped InP, and a InP doping concentration of any one of the first and second potential barrier layers is $1.0 \times 10^{18}$ $cm^{-3}$~$1.5 \times 10^{18}$ $cm^{-3}$, a thickness of any one of the first and the second potential barrier layers is 50 nm~100 nm.

8. The method according to claim 1, wherein the first and second gate dielectric layers are formed by MOCVD, ALD, or MBE, the thickness of any one of the first and second gate dielectric layers is 1 nm~5 nm.

9. The method according to claim 8, wherein any one of the first gate dielectric layer and the second gate dielectric layer is $Al_2O_3$ or $TiSiO_x$.

10. The method according to claim 1, wherein the first and second gates are formed by physical vapor deposition (PVD), MOCVD, ALD, or MBE, and any one of the first and second gates is TiN, NiAu or CrAu.

11. The method according to claim 1, further comprising: forming a first source, a first drain, a second source, and a second drain on the first source region, the first drain region, the second source region, and the second drain region respectively.

12. The method according to claim 11, wherein any one of the first source, the first drain, the second source, and the second drain is one of TiN, NiAu and CrAu.

* * * * *